(12) United States Patent
Beall et al.

(10) Patent No.: US 11,258,419 B2
(45) Date of Patent: Feb. 22, 2022

(54) GLASS-CERAMIC MICROWAVE FILTERS

(71) Applicant: CORNING INCORPORATED, Corning, NY (US)

(72) Inventors: George Halsey Beall, Big Flats, NY (US); Nicholas Francis Borrelli, Elmira, NY (US); Ling Cai, Painted Post, NY (US); Karl William Koch, III, Elmira, NY (US); Steven Alvin Tietje, Lindley, CA (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 17/023,713

(22) Filed: Sep. 17, 2020

(65) Prior Publication Data

US 2021/0099147 A1  Apr. 1, 2021

Related U.S. Application Data

(60) Provisional application No. 62/906,396, filed on Sep. 26, 2019.

(51) Int. Cl.
*H03H 1/00* (2006.01)
*H01Q 1/50* (2006.01)

(52) U.S. Cl.
CPC ............... *H03H 1/00* (2013.01); *H01Q 1/50* (2013.01); *H03H 2001/0021* (2013.01); *H03H 2001/0085* (2013.01)

(58) Field of Classification Search
CPC ............. H03H 2001/0085; H03H 1/00; H03H 7/0115; H01P 1/203
USPC .......................................................... 333/185
See application file for complete search history.

(56) References Cited

U.S. PATENT DOCUMENTS

| 8,471,650 | B2 * | 6/2013 | Yoshikawa | ........... H01P 1/2135 |
| | | | | 333/134 |
| 8,797,211 | B2 | 8/2014 | Valdes-Garcia | |
| 8,810,338 | B2 * | 8/2014 | Fukunaga | ........... H01P 1/20345 |
| | | | | 333/204 |

(Continued)

OTHER PUBLICATIONS

Dai et al; "Use of Titanates to Achieve Temperature-Stable Low-Temperature Cofired Ceramic Dielectric for Wireless Applications"; J. Am. Ceram. Soc., 2002, 85, 828-832.

(Continued)

*Primary Examiner* — Rakesh B Patel
(74) *Attorney, Agent, or Firm* — Svetlana Z. Short; Russell S. Magaziner (57) ABSTRACT

Embodiments of a filter for electromagnetic radiation are disclosed herein. The filter includes a first glass-ceramic substrate having a first refractive index, a second glass-ceramic substrate having the first refractive index, and a first region disposed between the first glass-ceramic substrate and the second glass-ceramic substrate. The first region has a second refractive index that is less than the first refractive index. Further, the second glass-ceramic substrate is arranged substantially parallel to and spatially disposed from the first glass-ceramic substrate. The filter transmits at least 70% of electromagnetic radiation within a band of frequencies and reflects at least 80% of electromagnetic radiation outside the band of frequencies. The band of frequencies is located within the frequency range of 20 GHz to 100 GHz.

18 Claims, 6 Drawing Sheets

(56) References Cited

U.S. PATENT DOCUMENTS

| 9,272,944 | B2 | 3/2016 | Letz et al. | |
|---|---|---|---|---|
| 2019/0268046 | A1* | 8/2019 | Kim | H01Q 21/28 |
| 2020/0204142 | A1* | 6/2020 | Choi | H03H 1/00 |

OTHER PUBLICATIONS

Krzmanc et al; "The Synthesis and Microwave Dielectric Properites of SrX—Ba1—XAl2Si2o8 AND CaYBa1—YAl2SiO8 Ceramics"; Journal of the European Ceramic Society, 27 (207) 1181-1185.

McCauley, "Polymorphism and Dielectric Electri Properties of B and Sr-Containing Feldspars"; J. Mater. Sci. 2000, 35, 3939-3942.

Tsunooka et al; "Effects of TiO2 on Sinterability and Dielectric Properties High-Q Forsterite Ceramics"; J. Eur. Ceram. Soc., 2003, 23, 2573-2578.

* cited by examiner

GLASS-CERAMIC MICROWAVE FILTERS

CROSS-REFERENCE TO RELATED APPLICATIONS

This application claims the benefit of priority under 35 U.S.C. § 119 of U.S. Provisional Application Ser. No. 62/906,396 filed on Sep. 26, 2019, the content of which is relied upon and incorporated herein by reference in its entirety.

BACKGROUND

The disclosure relates generally to filters for electromagnetic radiation and, in particular, to a filter including a plurality of glass-ceramic substrates configured to transmit a desired 5G signal. Deployment of the 5G network has required the installation of many new antennas to send and receive 5G signals. Such antennas relay data throughout the network in a highly directional manner. Efficient sending and receiving of these 5G signals allows for the 5G network to be built out in an economical manner.

SUMMARY

In one aspect, embodiments of the disclosure relate to a filter for electromagnetic radiation. The filter includes a first glass-ceramic substrate having a first refractive index, a second glass-ceramic substrate having the first refractive index, and a first region disposed between the first glass-ceramic substrate and the second glass-ceramic substrate. The first region has a second refractive index that is less than the first refractive index. Further, the second glass-ceramic substrate is arranged substantially parallel to and spatially disposed from the first glass-ceramic substrate. The filter transmits at least 70% of electromagnetic radiation within a band of frequencies and reflects at least 80% of electromagnetic radiation outside the band of frequencies. The band of frequencies is located within the frequency range of 20 GHz to 100 GHz.

In another aspect, embodiments of the disclosure relate to an antenna unit. The antenna unit includes an antenna array comprising a plurality of antennas and a microwave filter. The antenna array defines a first plane, and the microwave filter is arranged substantially parallel to the first plane. Further, the microwave filter is spatially disposed from the antenna array. The microwave filter includes a first glass-ceramic substrate having a first refractive index, a second glass-ceramic substrate having the first refractive index, and a first region disposed between the first glass-ceramic substrate and the second glass-ceramic substrate. The first region has a second refractive index that is less than the first refractive index. Further, the second glass-ceramic substrate is arranged substantially parallel to and spatially disposed from the first glass-ceramic substrate. The filter transmits at least 70% of electromagnetic radiation within a band of frequencies and reflects at least 80% of electromagnetic radiation outside the band of frequencies. The band of frequencies is located within the frequency range of 20 GHz to 100 GHz.

In still another aspect, embodiments of the disclosure relate to a method of filtering electromagnetic radiation incident upon an antenna unit having an antenna array. In the method, a microwave filter is provided between the electromagnetic radiation and the antenna array. The microwave filter includes a first glass-ceramic substrate having a first refractive index, a second glass-ceramic substrate having the first refractive index, and a first region disposed between the first glass-ceramic substrate and the second glass-ceramic substrate. The first region has a second refractive index that is less than the first refractive index. In the method, at least 70% of electromagnetic radiation within a band of frequencies is located within the frequency range of 20 GHz to 100 GHz is transmitted through the microwave filter. Further, at least 80% of electromagnetic radiation outside the band of frequencies is reflected from the microwave filter.

Additional features and advantages will be set forth in the detailed description that follows, and, in part, will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

BRIEF DESCRIPTION OF THE DRAWINGS

The accompanying drawings are included to provide a further understanding and are incorporated in and constitute a part of this specification. The drawings illustrate one or more embodiment(s), and together with the description serve to explain principles and the operation of the various embodiments. In the drawings.

DETAILED DESCRIPTION

Embodiments of the present disclosure relate to a glass-ceramic microwave filters for 5G applications. Embodiments of the glass-ceramic microwave filters disclosed herein are configured as band-pass filters that transmit electromagnetic radiation at a desired frequency or frequency interval, reflecting electromagnetic radiation at undesired frequencies. Various embodiments of the glass-ceramic microwave filter for use in an antenna unit, in particular that is usable in the 5G infrastructure, are disclosed herein. Advantageously, the microwave filters made with glass-ceramics disclosed herein have the requisite dielectric properties for use as filters in the mm-wave range while also possessing a low loss tangent and being much more economical than other similar materials such as fused silica. The low loss tangent in particular allows for the creation of interference filters in the 5G frequency domain according to various embodiments described herein. These embodiments are presented by way of example and not by way of limitation.

Figure 1:
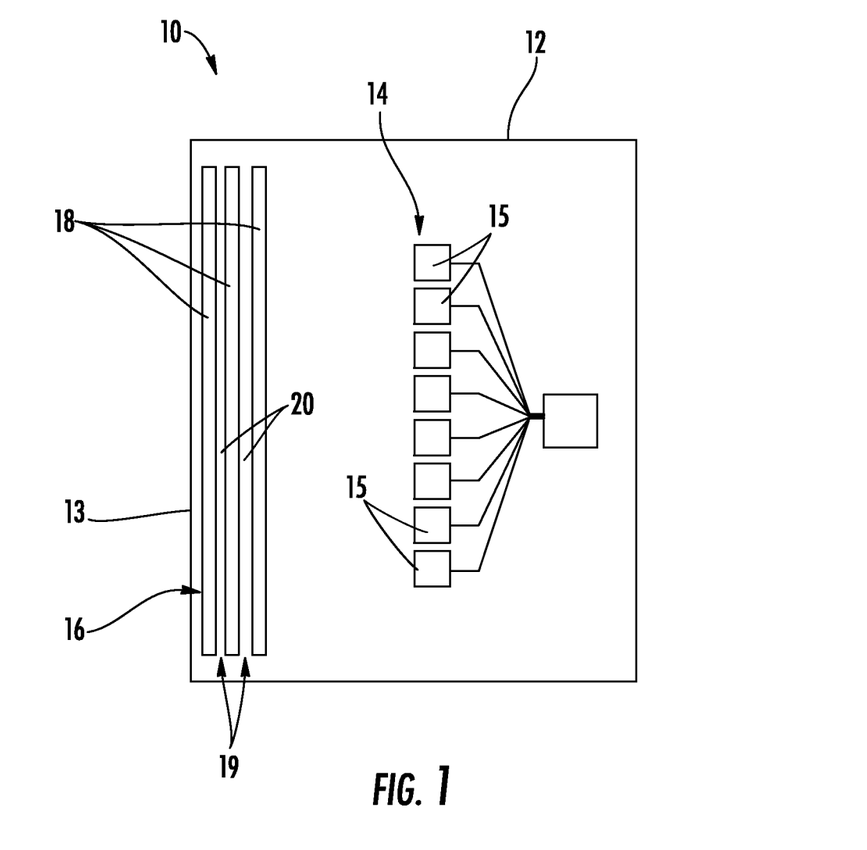
FIG. 1 is a schematic representation of an antenna unit having a glass-ceramic microwave filter, according to an exemplary embodiment.

FIG. 1 depicts an embodiment of an antenna unit 10 having a housing 12 surrounding an antenna array 14. In embodiments, the antenna array 14 comprises a plurality of individual antennas 15, such as patch antennas, mounted to a ground plane. In embodiments, the patch antennas 15 are rectangular sheets (i.e., "patches") of metal that may be connected with microstrip transmission lines so as to group the antennas into multiple phased arrays. The housing 12 includes a cover plate 13, and disposed within the antenna unit 10 is a microwave filter 16. In embodiments, the microwave filter 16 is behind the cover plate 13, and in other embodiments, the microwave filter 16 acts as the cover plate 13 of the antenna unit 10. In embodiments, the microwave filter 16 comprises one or more glass-ceramic substrates 18 arranged in a stack such that the glass-ceramic substrates 18 are substantially parallel to and spatially disposed from a plane defined by the antenna array 14. By "substantially parallel," it is meant that the plane of the glass-ceramic substrates 18 are parallel to within +/−5° to the plane of the antenna array 14. The glass-ceramic substrates 18 are separated from each other by a region 19 of a material having a lower refractive index than the glass-ceramic substrates 18. In the embodiment depicted in FIG. 1, the regions 19 are air gaps 20. However, in other embodiments, the glass-ceramic substrates 18 could be separated by, e.g., another glass-ceramic, such as a hydrogen foam. As will be disclosed herein, the microwave filter 16 acts as a band pass filter to remove noise from the desired electromagnetic waves incident upon the antenna unit 10.

In order to filter signals traveling into and out of the antenna unit 10, the microwave filter 16 utilizes the particular material of a glass-ceramic and arranges the glass-ceramic substrates 18 in particular structures to enhance transmission of electromagnetic waves at desired frequencies while reflecting electromagnetic waves at undesired frequencies. The ability of the microwave filter 16 to transmit microwave radiation at all is dependent upon the particular material used in the microwave filter 16. According to the present disclosure, the microwave filter 16 utilizes glass-ceramic as the material for the substrates. A variety of glass-ceramics can be used in the microwave filter 16 according to the present disclosure. Table 1, below, provides exemplary compositions of glass-ceramics that can be used in the microwave filters 16 according to the present disclosure. The glass-ceramics are presented by way of illustration, not by way of limitation. Other glass-ceramic materials having the properties discussed below can also used. In general, the glass-ceramic materials used herein have a composition of 45 mol % to 70 mol % of $SiO_2$, 12 mol % to 20 mol % $Al_2O_3$, 4 mol % to 10 mol % of $TiO_2$, 0 mol % to 10 mol % ZnO, and 3 mol % to 30 mol % MgO. In an embodiment, the ZnO and MgO together are present in the combined amount of 11 mol % to 30 mol %. One commercially available glass-ceramic usable as the glass-substrates 18 of the microwave filter 16 is Pyroceram® (Corning Code 9606, available from Corning Incorporated, Corning, N.Y.).

TABLE 1

Compositions of Glass-Ceramics usable in 5 G Microwave Filter

| Component | Mol % | | | | | |
|---|---|---|---|---|---|---|
| $SiO_2$ | 57.8 | 68.0 | 45.8 | 45.4 | 48.7 | 46.0 |
| $Al_2O_3$ | 12.2 | 12.9 | 15.0 | 15.0 | 18.3 | 17.1 |
| ZnO | 0.0 | 7.6 | 0.0 | 0.0 | 0.0 | 0.0 |
| MgO | 23.1 | 4.3 | 27.9 | 29.2 | 23.3 | 26.6 |
| BaO | 0.0 | 0.9 | 0.0 | 0.0 | 0.0 | 0.0 |
| CaO | 0.0 | 0.0 | 2.2 | 1.6 | 1.1 | 0.9 |
| $TiO_2$ | 7.0 | 4.3 | 9.0 | 8.9 | 7.9 | 9.3 |
| $ZrO_2$ | 0.0 | 1.7 | 0.0 | 0.0 | 0.0 | 0.0 |
| $As_2O_5$ | 0.0 | 0.3 | 0.0 | 0.0 | 0.0 | 0.0 |
| Phase Assemblage | Cordierite, Cristobalite, M. Spinel | Spinel | Cordierite, Enstatite, Magnesium Aluminum Titanate (MAT), M. Spinel | Cordierite, MAT | Cordierite, MAT | Spinel, Sapphirine |

TABLE 2

Properties of Materials used in Conventional Filters and in the Inventive Filters

| Freq (GHz) | Fused Silica | | Alumino-borosilicate | | Glass-Ceramic | | Borosilicate | | Alkali-Aluminosilicate | |
|---|---|---|---|---|---|---|---|---|---|---|
| | Dk | Loss tangent | Dk | Loss tangent | Dk | Loss tangent | Dk | Loss tangent | Dk | Loss tangent |
| 10 | 3.85 | 0.00015 | 5.15 | 0.0060 | 5.53 | 0.0002 | 4.1 | 0.0015 | 6.82 | 0.0214 |
| 20 | 3.85 | 0.00020 | 5.15 | 0.0070 | 5.53 | 0.00028 | 4.1 | 0.0023 | 6.8 | 0.024 |
| 30 | 3.85 | 0.00027 | 5.15 | 0.0077 | 5.53 | 0.00036 | 4.1 | 0.0026 | 6.8 | 0.027 |
| 40 | 3.85 | 0.00037 | 5.15 | 0.0084 | 5.53 | 0.00044 | 4.1 | 0.003 | 6.9 | 0.03 |

TABLE 2-continued

Properties of Materials used in Conventional Filters and in the Inventive Filters

| Freq (GHz) | Fused Silica | | Alumino-borosilicate | | Glass-Ceramic | | Borosilicate | | Alkali-Aluminosilicate | |
|---|---|---|---|---|---|---|---|---|---|---|
| | Dk | Loss tangent | Dk | Loss tangent | Dk | Loss tangent | Dk | Loss tangent | Dk | Loss tangent |
| 50 | 3.85 | 0.00045 | 5.15 | 0.0086 | 5.53 | 0.00055 | 4.1 | 0.0033 | 6.9 | 0.032 |
| 60 | 3.85 | 0.00065 | 5.15 | 0.0097 | 5.53 | 0.0007 | 4.1 | 0.0038 | 6.9 | 0.034 |

A composition of glass-ceramic usable in the microwave filter 16 as a region of low refractive index between the glass-ceramic substrates is a hydrogen microfoam having the composition of 55 wt % to 60 wt % of $SiO_2$, 8 wt % to 12 wt % of $B_2O_3$, 5 wt % to 10 wt % of ZnO, and 25 wt % to 30 wt % $P_2O_5$. In a particular embodiment, the composition of the hydrogen foam is 56.1 wt % $SiO_2$, 9.8 wt % $B_2O_3$, 7.6 wt % ZnO, and 26.5 wt % $P_2O_5$. The hydrogen microfoam has a relatively low dielectric constant of about 2. Further, the hydrogen microfoam can be used to bind the glass-ceramic substrates 18 together into the stack that acts as the microwave filter 16.

Table 2 includes the dielectric properties for certain conventional materials used in the filters and for the inventive filter using glass-ceramic substrates. Table 2 includes the materials of fused silica, aluminoborosilicate glass, glass-ceramic, borosilicate, and alkali aluminosilicate. As can be seen in Table 2, fused silica has very low loss tangent at the frequencies of 10 GHz to 60 GHz. However, fused silica is relatively much more expensive than any of the other materials listed in Table 2 and is impractical for extensive microwave applications. The glass-ceramic in Table 2 has a loss tangent that is comparable to that of the fused silica. Advantageously, glass-ceramics are less expensive to produce than fused silica, making wider adoption of glass-ceramics in microwave filters more economically practical than fused silica. Table 2 also demonstrates that the glasses have relatively high loss tangents. In particular, the glasses (aluminioborosilicate, borosilicate, and akali aluminiosilicate) all have loss tangents that are several orders of magnitude greater than the glass-ceramic. In embodiments, the losses are associated with the water (OH) content and with mobile cations in the glass, particularly the alkali ions. Thus, in terms of performance and relative expensive, glass-ceramics provide the best combination of properties for forming the microwave filters 16 according to the present disclosure.

Figure 2:
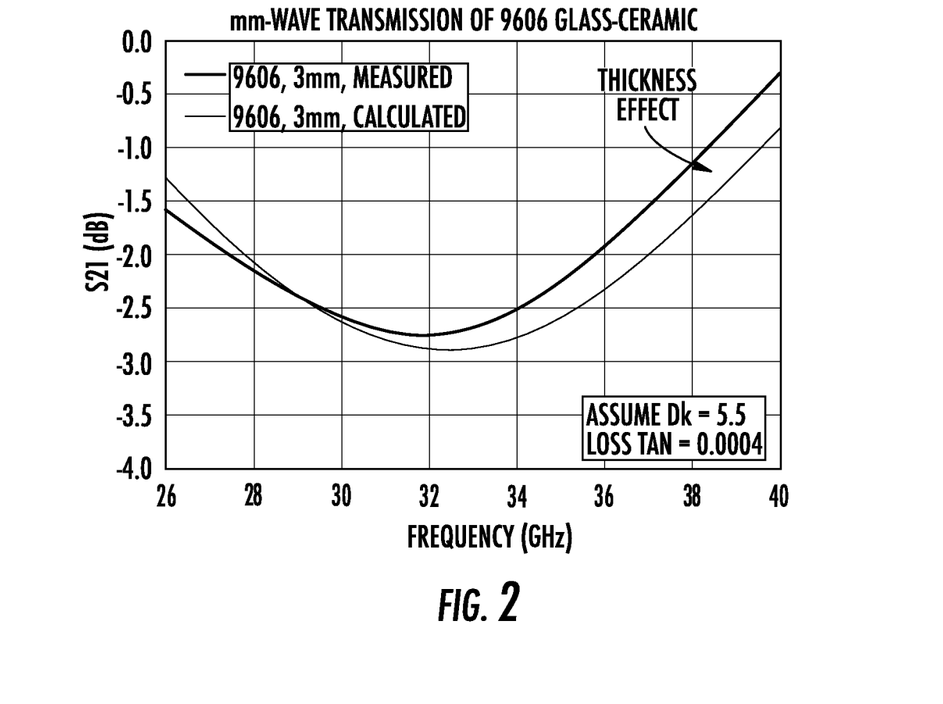
FIG. 2 is a graph of a transmission spectrum of a glass-ceramic material usable in the microwave filter, according to an exemplary embodiment.

FIG. 2 provides transmission properties of a particular glass-ceramic (Pyroceram®, Corning Code 9606). In particular, the S21 parameter is plotted as a function of frequency. The S21 parameter represents the power transmitted through the glass-ceramic relative to the power transmitted to the glass-ceramic. The glass-ceramic exhibits maxima and minima of transmission based on frequency of the incident radiation. FIG. 2 depicts two curves—one for the calculated transmission and the one for the measured transmission. The difference between the calculated and measured transmission relates to effect of thickness on transmission. As can be seen in FIG. 2, the glass-ceramic has a third-order minimum at about 32 GHz. The third-order minimum is located between a third-order maximum and a fourth-order maximum (not shown on the graph). The third order maximum is at about 9.4 GHz and the fourth order maximum is at about 43.5 GHz.

The maxima and minima for a particular material can be calculated using the following equations:

Minimum transmission: $nt = m_{even} \lambda / 2$ (1)

Maximum transmission: $nt = m_{odd} \lambda / 4$ (2)

wherein n is the refractive index of the glass-ceramic, t is the thickness of the glass ceramic, $m_{even}$ are even integers (2, 4, 6, ...), $m_{odd}$ are odd integers (1, 3, 5, ...), and λ is the wavelength of the incident electromagnetic radiation.

Using Equations (1) and (2), the full wave optical thickness (FWOT) can be determined according to the following relationship:

$$FWOT = nt / \lambda$$

Figure 3:
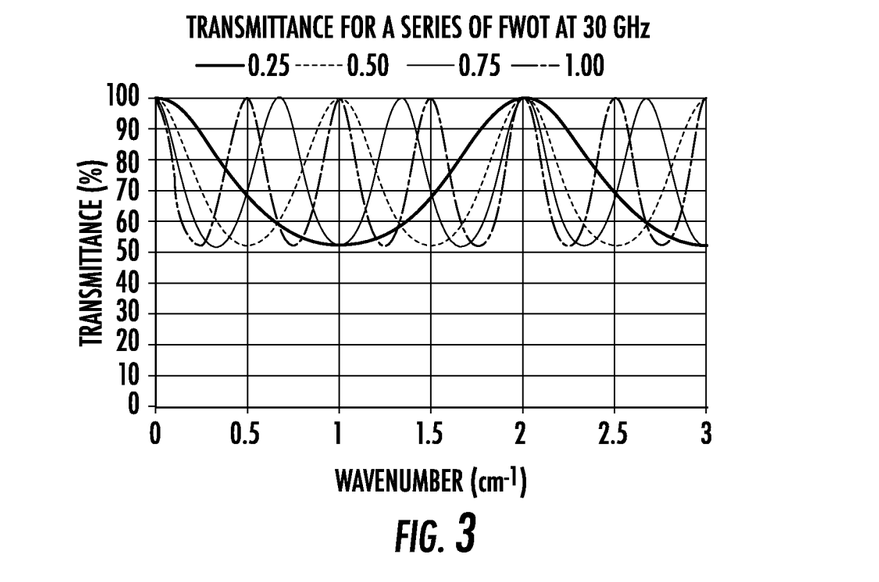
FIG. 3 is a graph of transmittance for a series of optical thicknesses at 30 GHz, according to an exemplary embodiment.
Figure 4:
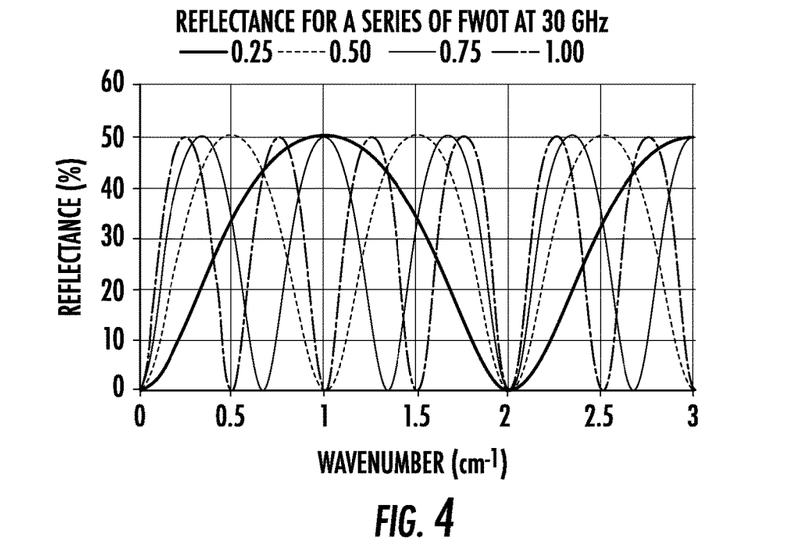
FIG. 4 is a graph of reflectance for a series of optical thicknesses at 30 GHz, according to an exemplary embodiment.

FIGS. 3 and 4 depict maximum transmission and reflectance for the glass-ceramic Pyroceram® (Corning Code 9606) at 30 GHz for various optical thicknesses (FWOT). The FWOT is varied by varying the number of glass-ceramic layers in the stack of glass. As can be seen in FIGS. 3 and 4, the glass-ceramic exhibits maximum transmittance and minimum reflectance at a wavenumber of 2 $cm^{-1}$ (λ=5 mm or half the full wavelength at 30 GHz) for each optical thickness. Further, in the embodiment of FIG. 4, the dynamic range of the transmission and reflection is limited to 50%. However, by stacking low-loss glass-ceramic substrates in designated intervals, the dynamic range of the reflection or transmission can be increased to almost 100%.

Figure 5A:
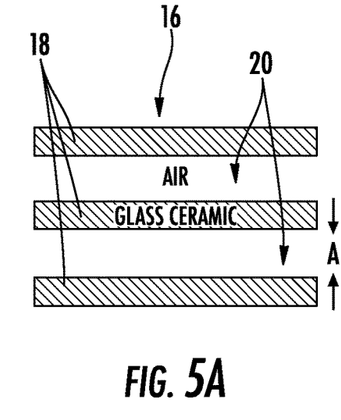
FIGS. 5A-5C are a schematic representations of glass-ceramic filter stacks, according to exemplary embodiments.

FIGS. 5A-C and 7 provide examples of stacking arrangements for the glass-ceramic substrates 18 that form a microwave filter 16. Referring first to FIG. 5A, three glass-ceramic substrates 18 are provided in a stack and each glass-substrate 18 is separated by an air gap 20. In the embodiment depicted in FIG. 5A, the number of glass-ceramic substrates 18 used was three, and the glass-ceramic substrates 18 were separated by two air gaps 20. In embodiments, the number of glass-ceramic substrates 18 can be from 1 to 20, and the number of air gaps 20 between the glass-ceramic substrates 18 will be one less than the number of glass-ceramic substrates 18. The width A of the air gap 20 is used to tune the frequency that is transmitted through the glass-ceramic substrates 18. In an exemplary embodiment of FIG. 5A, the desired frequency was 30 GHz (which corresponds to a wavelength of 10 mm), and the air gap 20 was set at a quarter wavelength, or 2.5 mm. In the exemplary embodiment, the thickness B of the glass-ceramic substrates 18 was set to 1.07 mm. The thickness of the glass-ceramic substrates 18 is determined by the desired FWOT. The refractive index of the material and the desired frequency to transmit (and thus the wavelength) are known, and so, the thicknesses B of the glass-ceramic substrates 18 are determined based on the desired transmittance and reflectance (e.g., as shown in FIGS. 3 and 4).

Figure 6:
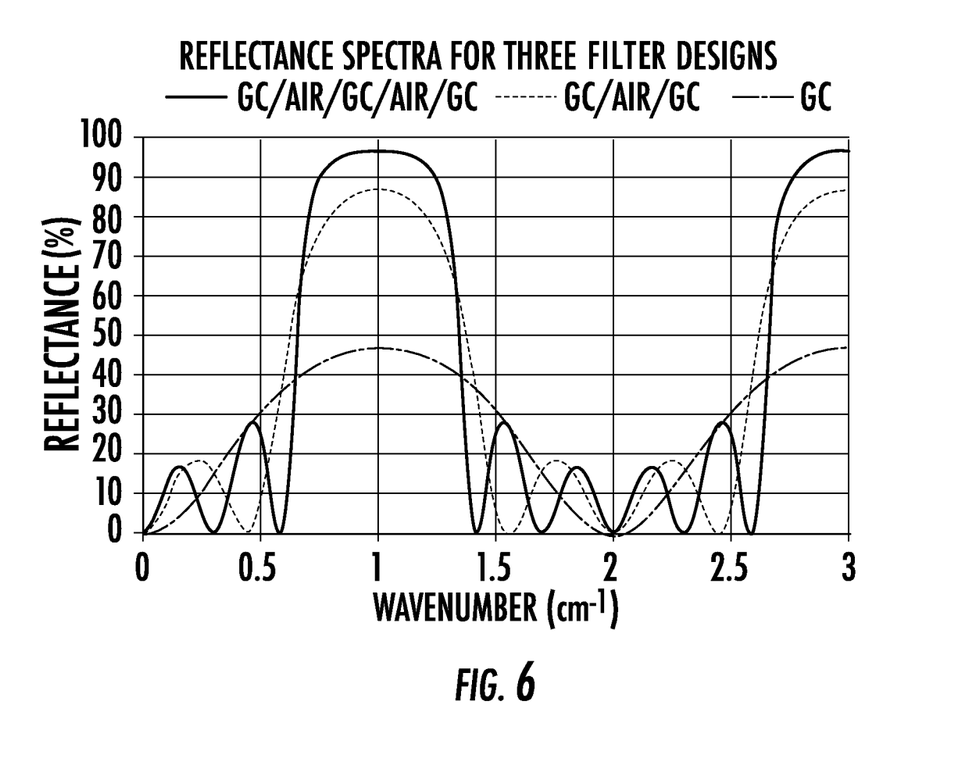
FIG. 6 is a graph of reflectance spectra for the glass-ceramic filter stacks of FIGS. 5A-5C, according to exemplary embodiments.

FIG. 6 depicts the reflectance of the microwave filter 16 constructed as shown in FIG. 5A. As can be seen, the reflectance is over 90% at wavenumbers below about 1.5 cm$^{-1}$ and above about 2.5 cm$^{-1}$, defining a band of where transmittance is greater than about 70% between about 1.5 cm$^{-1}$ and 2.5 cm$^{-1}$ and centered on 2 cm$^{-1}$ (30 GHz).

Figure 5B:
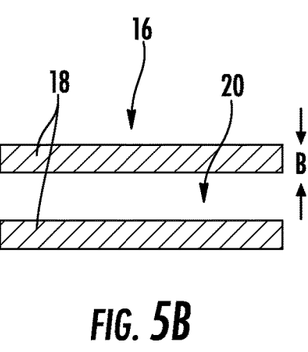

FIG. 5B depicts another embodiment of a microwave filter 16 containing two glass-ceramic substrates 18 separated by one air gap 20. The thickness B of the air gap 20 is again set to a quarter wavelength, or 2.5 mm, and the thickness A of the glass-ceramic substrates 18 was again 1.07 mm. As can be seen in FIG. 6, the reflectance for this microwave filter 16 also created a band of transmittance between 1.5 cm$^{-1}$ and 2.5$^{-1}$. However, the reflectance outside this band was lower but still above 80%. Transmittance across the band was also higher, being at least 80% across the band.

Figure 5C:
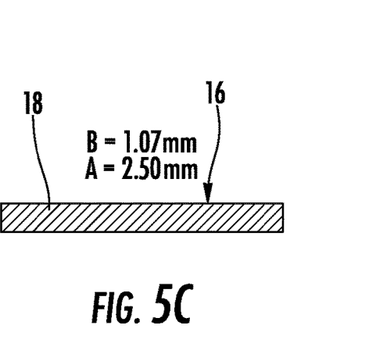

For the purpose of comparison, FIG. 5C depicts a single glass-ceramic substrate 18 with no air gap 20. The thickness B of the glass-ceramic substrate 18 was 1.07 mm. Absent the air gaps 20 or any other region of relatively lower refractive index, the reflectance as shown in FIG. 6 corresponded to the quarter FWOT shown in FIG. 4, where reflectance was capped at about 50%.

Figure 7:
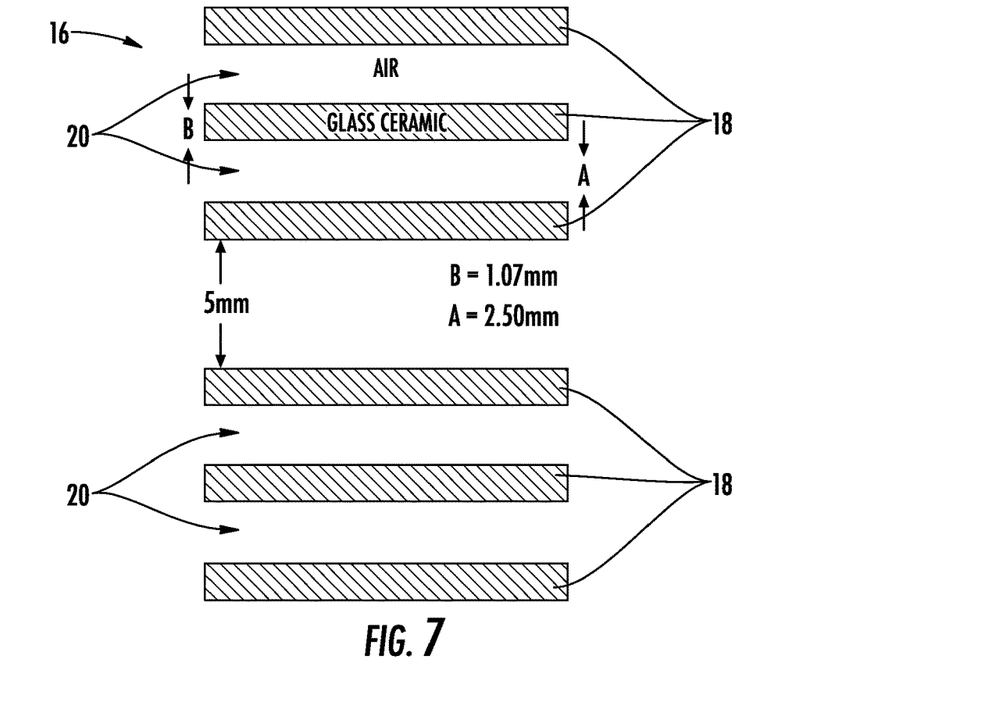
FIG. 7 is a schematic representation of a Fabry-Perot glass-ceramic filter stack, according to an exemplary embodiment.

In another embodiment shown in FIG. 7, the microwave filter 16 is constructed as a Fabry-Perot resonant frequency cavity designed to reduce the bandwidth to a narrow value. In FIG. 7, the microwave filter 16 includes six glass-ceramic substrates 18. A first set of three glass-ceramic substrates 18 are separated by two air gaps 20 in which the air gaps 20 have a thickness A corresponding to a quarter wavelength (2.5 mm for 30 GHz). A second set of three glass-ceramic substrates 18 are separated by air gaps 20 also having a thickness B of a quarter wavelength. Further, the sets of glass-ceramics are separated by a half wavelength (5 mm for 30 GHz).

Figure 8:
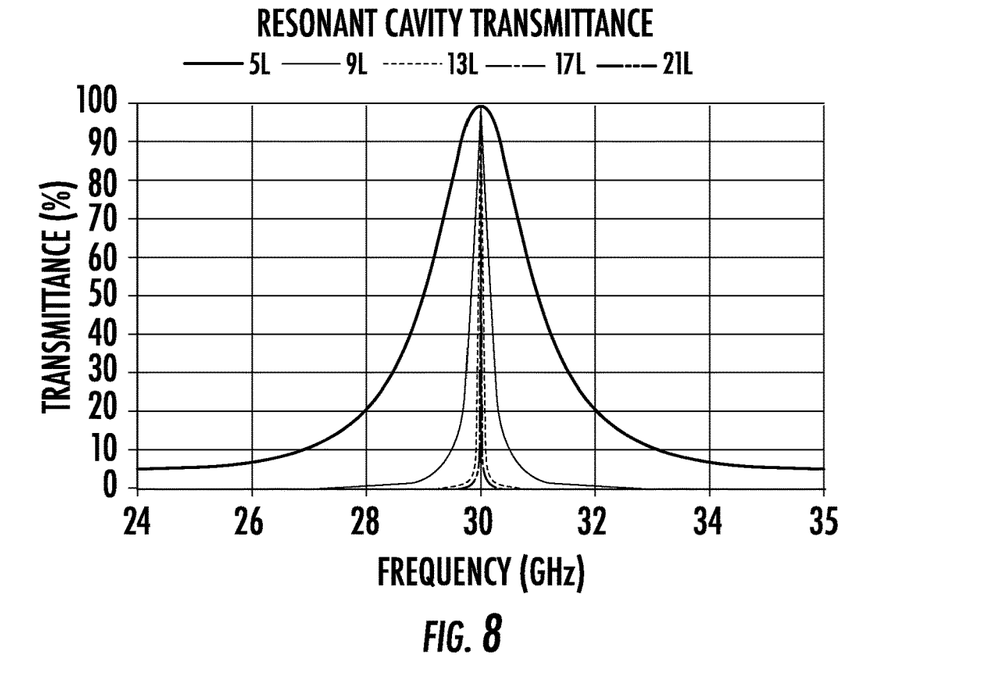
FIG. 8 is a graph of the transmittance for Fabry-Perot glass-ceramic filter stacks having an increasing number of layers, according to an exemplary embodiment.

The transmittance of the microwave filter 16 is shown in FIG. 8. The embodiment of FIG. 7 is referred to as "5L" for the number of layers (in the case of FIG. 7, air gaps 20) between the glass-ceramic substrates 18. For the 5L design of FIG. 7, transmittance at 30 GHz is 100%, and at frequencies above or below 30 GHz, the transmittance falls off sharply. At 28 GHz and 32 GHz, the transmittance is less than 20%. As shown in FIG. 8, the transmittance band can be further narrowed by including additional layers of relatively low refractive index material, such as air gaps 20, between the glass-ceramic substrates 18. FIG. 8 specifically shows transmittance curves for Fabry-Perot-type microwave filters having 9 layers, 13 layers, 17 layers, and 21 layers of relatively low dielectric material. The additional layers continue to narrow the band to the desired frequency, which in the embodiments of FIGS. 7 and 8 is 30 GHz.

Figure 9:
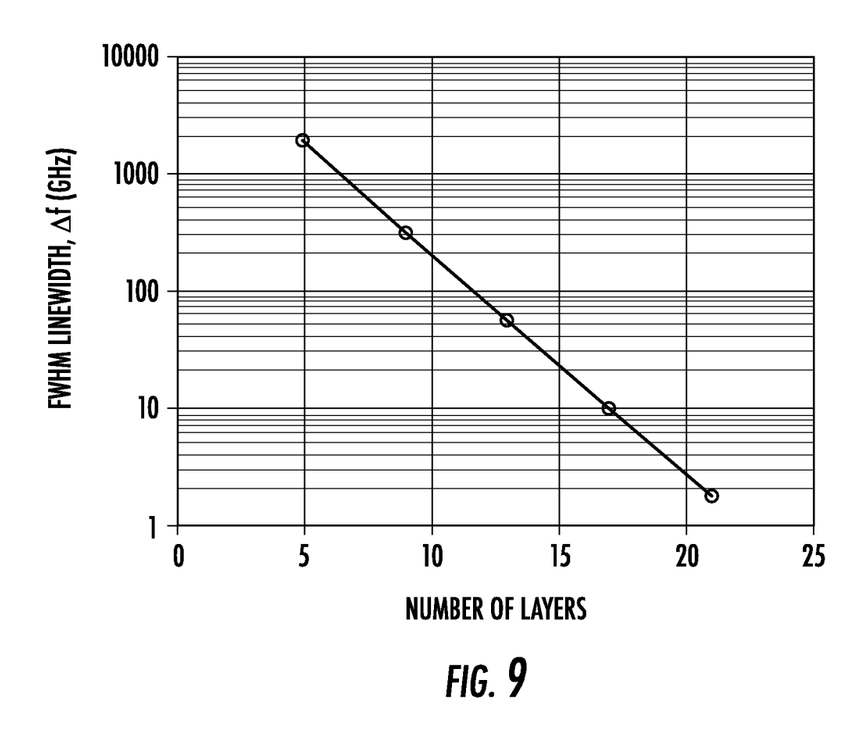
FIG. 9 is a graph of the bandwidth of the transmittance as a function of the number of layers in the glass-ceramic filter stack, according to an exemplary embodiment.

FIG. 9 depicts the narrowing of the frequency band (FWHM linewidth) on a logarithmic scale plot. As shown in FIG. 9, the band is over 1000 MHz wide when there are 5 layers between the glass-ceramic substrates 18. At 21 layers, the band narrows to less than 10 MHz wide, particularly less than about 2 MHz wide.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A method of filtering electromagnetic radiation incident upon an antenna unit comprising an antenna array, comprising the steps of:
   providing a microwave filter between the electromagnetic radiation and the antenna array, the microwave filter comprising a first glass-ceramic substrate having a first refractive index, a second glass-ceramic substrate having the first refractive index, and a first region disposed between the first glass-ceramic substrate and the second glass-ceramic substrate, wherein the first region has a second refractive index that is less than the first refractive index;
   transmitting at least 70% of electromagnetic radiation within a band of frequencies through the microwave filter, the band of frequencies being located within a frequency range of 20 GHz to 100 GHz; and
   reflecting at least 80% of electromagnetic radiation outside the band of frequencies from the microwave filter, wherein the first glass-ceramic substrate and the second glass-ceramic substrate each have a composition comprising:
   45 mol % to 70 mol % of $SiO_2$;
   12 mol % to 20 mol % $Al_2O_3$;
   4 mol % to 10 mol % of $TiO_2$;
   0 mol % to 10 mol % ZnO; and
   3 mol % to 30 mol % MgO.

2. A filter for electromagnetic radiation, comprising:
   a first glass-ceramic substrate having a first refractive index;
   a second glass-ceramic substrate having the first refractive index, the second glass-ceramic substrate being arranged substantially parallel to and spatially disposed from the first glass-ceramic substrate; and
   a first region disposed between the first glass-ceramic substrate and the second glass-ceramic substrate, the first region having a second refractive index that is less than the first refractive index;
   wherein the filter transmits at least 70% of electromagnetic radiation within a band of frequencies and reflects at least 80% of electromagnetic radiation outside the band of frequencies; and
   wherein the band of frequencies is located within a frequency range of 20 GHz to 100 GHz, wherein the band of frequencies has a width that is 2 GHz or less.

3. The filter of claim 2, wherein the first region is an air gap.

4. The filter of claim 2, further comprising:
   a third glass-ceramic substrate having the first refractive index;
   a second region disposed between the second glass-ceramic substrate and the third glass-ceramic substrate, the second region having the second refractive index;
   wherein the filter reflects at least 90% of electromagnetic radiation outside the band of frequencies.

5. A filter for electromagnetic radiation, comprising:
   a first glass-ceramic substrate having a first refractive index;

a second glass-ceramic substrate having the first refractive index, the second glass-ceramic substrate being arranged substantially parallel to and spatially disposed from the first glass-ceramic substrate; and a first region disposed between the first glass-ceramic substrate and the second glass-ceramic substrate, the first region having a second refractive index that is less than the first refractive index;

wherein the filter transmits at least 70% of electromagnetic radiation within a band of frequencies and reflects at least 80% of electromagnetic radiation outside the band of frequencies; and wherein the band of frequencies is located within a frequency range of 20 GHz to 100 GHz, wherein the band of frequencies is centered on a particular frequency and wherein the first region has a thickness equal to a quarter of a wavelength of a wave having the particular frequency.

6. A filter for electromagnetic radiation, comprising:

a first glass-ceramic substrate having a first refractive index;

a second glass-ceramic substrate having the first refractive index, the second glass-ceramic substrate being arranged substantially parallel to and spatially disposed from the first glass-ceramic substrate; and a first region disposed between the first glass-ceramic substrate and the second glass-ceramic substrate, the first region having a second refractive index that is less than the first refractive index;

wherein the filter transmits at least 70% of electromagnetic radiation within a band of frequencies and reflects at least 80% of electromagnetic radiation outside the band of frequencies; and wherein the band of frequencies is located within a frequency range of 20 GHz to 100 GHz, wherein the first glass-ceramic substrate, the first region, the second glass-ceramic substrate comprise a first set of layers and wherein the filter further comprises:

a second set of layers, comprising:
  a third glass-ceramic substrate having the first refractive index;
  a fourth glass-ceramic substrate having the first refractive index, the fourth glass-ceramic substrate being arranged substantially parallel to and spatially disposed from the third glass-ceramic substrate; and
  a second region disposed between the third glass-ceramic substrate and the fourth glass-ceramic substrate, the second region having the second refractive index;

wherein the band of frequencies is centered on a particular frequency;

wherein the first region and the second region each have a first thickness equal to a quarter of a wavelength of a wave having the particular frequency;

wherein a third region is disposed between the first set of layers and the second set of layers, the third region having the second refractive index; and wherein the third region has a second thickness equal to half of the wavelength of the wave having the particular frequency.

7. The filter of claim 6, wherein the band of frequencies has a width of 100 MHz or less.

8. A filter for electromagnetic radiation, comprising:

a first glass-ceramic substrate having a first refractive index;

a second glass-ceramic substrate having the first refractive index, the second glass-ceramic substrate being arranged substantially parallel to and spatially disposed from the first glass-ceramic substrate; and a first region disposed between the first glass-ceramic substrate and the second glass-ceramic substrate, the first region having a second refractive index that is less than the first refractive index;

wherein the filter transmits at least 70% of electromagnetic radiation within a band of frequencies and reflects at least 80% of electromagnetic radiation outside the band of frequencies; and wherein the band of frequencies is located within a frequency range of 20 GHz to 100 GHz, wherein the first glass-ceramic substrate and the second glass-ceramic substrate each have a composition comprising:

45 mol % to 70 mol % of $SiO_2$;
12 mol % to 20 mol % $Al_2O_3$;
4 mol % to 10 mol % of $TiO_2$;
0 mol % to 10 mol % ZnO; and
3 mol % to 30 mol % MgO.

9. A filter for electromagnetic radiation, comprising:

a first glass-ceramic substrate having a first refractive index;

a second glass-ceramic substrate having the first refractive index, the second glass-ceramic substrate being arranged substantially parallel to and spatially disposed from the first glass-ceramic substrate; and a first region disposed between the first glass-ceramic substrate and the second glass-ceramic substrate, the first region having a second refractive index that is less than the first refractive index;

wherein the filter transmits at least 70% of electromagnetic radiation within a band of frequencies and reflects at least 80% of electromagnetic radiation outside the band of frequencies; and wherein the band of frequencies is located within a frequency range of 20 GHz to 100 GHz, wherein the first region comprises a hydrogen microfoam, comprising:

55 wt % to 60 wt % of $SiO_2$;
8 wt % to 12 wt % of $B_2O_3$;
5 wt % to 10 wt % of ZnO; and
25 wt % to 30 wt % $P_2O_5$.

10. A method of filtering electromagnetic radiation incident upon an antenna unit comprising an antenna array, comprising the steps of:

providing a microwave filter between the electromagnetic radiation and the antenna array, the microwave filter comprising a first glass-ceramic substrate having a first refractive index, a second glass-ceramic substrate having the first refractive index, and a first region disposed between the first glass-ceramic substrate and the second glass-ceramic substrate, wherein the first region has a second refractive index that is less than the first refractive index;

transmitting at least 70% of electromagnetic radiation within a band of frequencies through the microwave filter, the band of frequencies being located within a frequency range of 20 GHz to 100 GHz; and reflecting at least 80% of electromagnetic radiation outside the band of frequencies from the microwave filter, wherein the band of frequencies is centered on a particular frequency and wherein the first region has a thickness equal to a quarter of a wavelength of a wave having the particular frequency.

11. An antenna unit, comprising:

an antenna array comprising a plurality of antennas, the antenna array defining a first plane; and a microwave filter arranged substantially parallel to the first plane and the microwave filter being spatially disposed from the antenna array, the microwave filter comprising:
  a first glass-ceramic substrate having a first refractive index;
  a second glass-ceramic substrate having the first refractive index, the second glass-ceramic substrate being arranged substantially parallel to and spatially disposed from the first glass-ceramic substrate; and
  a first region disposed between the first glass-ceramic substrate and the second glass-ceramic substrate, the first region having a second refractive index that is less than the first refractive index;
wherein the microwave filter transmits to the antenna array at least 70% of electromagnetic radiation within a band of frequencies and reflects at least 80% of electromagnetic radiation outside the band of frequencies; and
wherein the band of frequencies is located within a frequency range of 20 GHz to 100 GHz,
wherein the band of frequencies has a width that is 2 GHz or less.

12. The antenna unit of claim 11, wherein the first region is an air gap or a hydrogen microfoam.

13. The antenna unit of claim 11, wherein the microwave filter further comprises:
  a third glass-ceramic substrate having the first refractive index;
  a second region disposed between the second glass-ceramic substrate and the third glass-ceramic substrate, the second region having the second refractive index;
  wherein the microwave filter reflects at least 90% of electromagnetic radiation outside the band of frequencies.

14. An antenna unit, comprising:
an antenna array comprising a plurality of antennas, the antenna array defining a first plane; and
a microwave filter arranged substantially parallel to the first plane and the microwave filter being spatially disposed from the antenna array, the microwave filter comprising:
  a first glass-ceramic substrate having a first refractive index;
  a second glass-ceramic substrate having the first refractive index, the second glass-ceramic substrate being arranged substantially parallel to and spatially disposed from the first glass-ceramic substrate; and
  a first region disposed between the first glass-ceramic substrate and the second glass-ceramic substrate, the first region having a second refractive index that is less than the first refractive index;
wherein the microwave filter transmits to the antenna array at least 70% of electromagnetic radiation within a band of frequencies and reflects at least 80% of electromagnetic radiation outside the band of frequencies; and
wherein the band of frequencies is located within a frequency range of 20 GHz to 100 GHz wherein the first glass-ceramic substrate, the first region, the second glass-ceramic substrate comprise a first set of layers and wherein the microwave filter further comprises:
a second set of layers, comprising:
  a third glass-ceramic substrate having the first refractive index;
  a fourth glass-ceramic substrate having the first refractive index; and
  a second region disposed between the third glass-ceramic substrate and the fourth glass-ceramic substrate, the second region having the second refractive index;
wherein the band of frequencies is centered on a particular frequency;
wherein the first region and the second region each have a first thickness equal to a quarter of a wavelength of a wave having the particular frequency;
wherein a third region is disposed between the first set of layers and the second set of layers, the third region having the second refractive index; and
wherein the third region has a second thickness equal to half of the wavelength of the wave having the particular frequency.

15. An antenna unit, comprising:
an antenna array comprising a plurality of antennas, the antenna array defining a first plane; and
a microwave filter arranged substantially parallel to the first plane and the microwave filter being spatially disposed from the antenna array, the microwave filter comprising:
  a first glass-ceramic substrate having a first refractive index;
  a second glass-ceramic substrate having the first refractive index, the second glass-ceramic substrate being arranged substantially parallel to and spatially disposed from the first glass-ceramic substrate; and
  a first region disposed between the first glass-ceramic substrate and the second glass-ceramic substrate, the first region having a second refractive index that is less than the first refractive index;
wherein the microwave filter transmits to the antenna array at least 70% of electromagnetic radiation within a band of frequencies and reflects at least 80% of electromagnetic radiation outside the band of frequencies; and
wherein the band of frequencies is located within a frequency range of 20 GHz to 100 GHz, wherein the first glass-ceramic substrate and the second glass-ceramic substrate each have a composition comprising:
  45 mol % to 70 mol % of $SiO_2$;
  12 mol % to 20 mol % of $Al_2O_3$;
  4 mol % to 10 mol % of $TiO_2$;
  0 mol % to 10 mol % of ZnO; and
  3 mol % to 30 mol % MgO.

16. A method of filtering electromagnetic radiation incident upon an antenna unit comprising an antenna array, comprising the steps of:
providing a microwave filter between the electromagnetic radiation and the antenna array, the microwave filter comprising a first glass-ceramic substrate having a first refractive index, a second glass-ceramic substrate having the first refractive index, and a first region disposed between the first glass-ceramic substrate and the second glass-ceramic substrate, wherein the first region has a second refractive index that is less than the first refractive index;
transmitting at least 70% of electromagnetic radiation within a band of frequencies through the microwave filter, the band of frequencies being located within a frequency range of 20 GHz to 100 GHz; and
reflecting at least 80% of electromagnetic radiation outside the band of frequencies from the microwave filter, wherein the band of frequencies has a width that is 2 GHz or less.

17. The method of claim 16, wherein the microwave filter further comprises a third glass-ceramic substrate having the first refractive index and a second region disposed between the second glass-ceramic substrate and the third glass-ceramic substrate, the second region having the second refractive index; and
  wherein the step of reflecting further comprising reflecting at least 90% of electromagnetic radiation outside the band of frequencies.

18. The method of claim 16, wherein the first region is an air gap or a hydrogen microfoam.

* * * * *

UNITED STATES PATENT AND TRADEMARK OFFICE
CERTIFICATE OF CORRECTION

PATENT NO. : 11,258,419 B2
APPLICATION NO. : 17/023713
DATED : February 22, 2022
INVENTOR(S) : George Halsey Beall et al.

It is certified that error appears in the above-identified patent and that said Letters Patent is hereby corrected as shown below:

On the Title Page

On the page 2, in item (56), in Column 1, under "Other Publications", Line 1, delete "Properites" and insert -- Properties --.

On the page 2, in item (56), in Column 1, under "Other Publications", Line 4, delete "Electri" and insert -- Electric --.

On the page 2, in item (56), in Column 1, under "Other Publications", Line 4, delete "of B" and insert -- of Ba- --.

Signed and Sealed this
Seventeenth Day of May, 2022

Katherine Kelly Vidal
*Director of the United States Patent and Trademark Office*